(12) United States Patent
Okawa

(10) Patent No.: US 7,564,119 B2
(45) Date of Patent: Jul. 21, 2009

(54) ADHESIVE SHEET FOR LASER DICING AND ITS MANUFACTURING METHOD

(75) Inventor: Yuji Okawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 434 days.

(21) Appl. No.: 11/054,795

(22) Filed: Feb. 10, 2005

(65) Prior Publication Data
US 2005/0186709 A1   Aug. 25, 2005

(30) Foreign Application Priority Data
Feb. 20, 2004   (JP)   ............... 2004-044188

(51) Int. Cl.
H01L 23/58 (2006.01)

(52) U.S. Cl. ............... 257/629; 428/423.1; 219/121.72; 438/460

(58) Field of Classification Search .......... 438/33, 438/114, 113, 458, 460, 226, 227, 797; 257/629; 219/121.72; 428/423.1
See application file for complete search history.

(56) References Cited

U.S. PATENT DOCUMENTS

| | | | |
|---|---|---|---|
| 5,994,205 A | * | 11/1999 | Yamamoto et al. .......... 438/464 |
| 6,333,117 B1 | * | 12/2001 | Sumi et al. .................. 428/451 |
| 6,563,195 B1 | | 5/2003 | Tomaru et al. |
| 2002/0025431 A1 | | 2/2002 | Sawamura et al. |
| 2002/0042189 A1 | * | 4/2002 | Tanaka ....................... 438/450 |
| 2003/0026932 A1 | * | 2/2003 | Johnson et al. ............. 428/40.1 |
| 2003/0107807 A1 | * | 6/2003 | Saiki et al. .................. 359/485 |
| 2004/0018329 A1 | * | 1/2004 | Katoh et al. ................ 428/40.1 |
| 2004/0020338 A1 | * | 2/2004 | Ookawa ........................ 83/13 |
| 2005/0006728 A1 | * | 1/2005 | Shizuno ...................... 257/642 |

FOREIGN PATENT DOCUMENTS

| | | | |
|---|---|---|---|
| JP | 63-310132 | | 12/1988 |
| JP | 5-175332 | | 7/1993 |
| JP | 7-86212 | | 3/1995 |
| JP | 07221052 A | * | 8/1995 |
| JP | 11-92720 | | 4/1999 |
| JP | 2002173649 A | * | 6/2002 |
| JP | 2002-343747 | | 11/2002 |
| JP | 2002-347183 | | 12/2002 |
| JP | 2003-33887 | | 2/2003 |
| JP | 2003-34780 | | 2/2003 |

* cited by examiner

*Primary Examiner*—W. David Coleman
*Assistant Examiner*—Latanya Crawford
(74) *Attorney, Agent, or Firm*—Knobbe Martens Olson & Bear LLP (57) ABSTRACT

An adhesive sheet for laser dicing is used for dicing a workpiece into individual chips by light absorption ablation of laser beam and has at least an adhesive layer on one side of a base material which has a surface opposite to the adhesive layer having no convex parts of width (W) of 20 mm or less and height (h) of 1 μm or more, or no concave parts of width (W) of 20 mm or less and depth (d) of 1 μm or more.

10 Claims, 1 Drawing Sheet

ADHESIVE SHEET FOR LASER DICING AND ITS MANUFACTURING METHOD

BACKGROUND OF THE INVENTION

1. Field of the Invention

The present invention relates to an adhesive sheet for laser dicing used for supporting and fixing a workpiece when forming a reformed region inside the workpiece by light absorption ablation of laser beam and separating into individual pieces. The invention also relates to a manufacturing method of small pieces of element by separating into individual chips by light absorption ablation of laser beam by using various workpieces, such as circuit board, semiconductor wafer, glass substrate, ceramic substrate, metal substrate, light emitting or detecting element board of semiconductor laser, MEMS substrate, and semiconductor package.

2. Description of the Related Art

In manufacturing process of semiconductor related products, various circuits are formed on a substrate, and the surface is treated, and then the semiconductor substrate and the like is cut and separated (diced) to manufacture small pieces of element (for example, semiconductor devices, etc.). Specifically, an adhesive sheet is glued to the substrate, the substrate is diced by using a blade, and the adhesive sheet is expanded to separate into small pieces of element.

Recently, causing a little heat damage, the dicing method of semiconductor substrate by light absorption ablation by laser beam capable of processing at high precision is noticed as precise cutting method.

Technically, for example, a method is proposed for supporting and fixing a workpiece on a dicing sheet, and dicing the workpiece by laser beam (Japanese unexamined patent publication No. 2002-343747). The dicing sheet is composed of a base material including a support sheet, and an adhesive layer disposed at one side surface of the base material, and the adhesive layer can be cut off by laser beam, and the support sheet cannot be cut by laser beam.

Other method is proposed for dicing a semiconductor wafer by combining water microjet and laser (Japanese unexamined patent publication No. 2003-34780). On one side of a base material, a non-radiation curing type adhesive layer and a radiation curing type adhesive layer are disposed, and the base material allows to pass jet water stream of water jet, and the non-radiation curing type adhesive layer is interposed between the base material and the radiation curing type adhesive layer, according to this adhesive tape for laser dicing.

A further proposal is a laser processing method comprising a step of fixing a workpiece to be processed on a sheet of an adhesive surface, and a step of emitting laser beam by focusing on a spot inside the workpiece to be processed, and forming a reformed region inside the workpiece to be processed along an intended cutting line of the workpiece (Japanese unexamined patent publication No. 2003-33887).

When emitting laser beam, in order to form a reformed region at a uniform height inside the workpiece (the workpiece to be processed), it is required to focus the laser beam precisely in the intended area. In dicing by using an ordinary blade, thickness fluctuations of the workpiece of about several microns do not matter, but in the case of laser dicing, thickness fluctuations of the workpiece of about several microns may cause to deviate the focusing region of laser beam, and height of reformed region is not uniform, and height fluctuations in the reformed region may make it difficult to separate the workpiece into individual chips.

A certain laser dicing apparatus is equipped with a height adjusting mechanism, and the problem as described above may be solved by using such apparatus, but it takes much time in fine adjustment of height, and the production efficiency is poor, and it is not practicable. A workpiece having a large curvature may be machined somewhat by the laser dicing apparatus, but a workpiece having small undulations cannot be machined by the laser dicing apparatus.

Further, when separating into chips by expanding, depending on the adhesive sheet to be used, only the peripheral area of the sheet is expanded and the central area of the sheet is not expanded sufficiently, the central chips may not be separated neatly into individual pieces.

SUMMARY OF THE INVENTION

It is hence an object of the invention to present an adhesive sheet for laser dicing capable of dicing the workpiece into individual chips securely at high production efficiency when forming a reformed region inside the workpiece by light absorption ablation of laser beam, and its manufacturing method. It is also an object of the invention to present a method of manufacturing small pieces of element securely at high production efficiency by using the adhesive sheet for laser dicing.

The inventor has accumulated intensive studies to solve the problems, and has discovered that the objects can be achieved by using the adhesive sheet for laser dicing (hereinafter called adhesive sheet) described below, thereby completed the invention.

That is, the invention relates to an adhesive sheet for laser dicing, being an adhesive sheet for laser dicing used for dicing into individual chips by forming a reformed region inside of a workpiece by light absorption ablation of laser beam, in which the adhesive sheet has an adhesive layer at least on one side of a base material, and at least the base material surface not contacting with the adhesive layer is free from convex parts of width (W) of 20 mm or less and height (h) of 1 µm or more, and concave parts of width (W) of 20 mm or less and depth (d) of 1 µm or more.

The adhesive sheet is laminated to the attraction stage side (laser beam exit side) or laser beam incident side of a workpiece before laser processing of workpiece by light absorption ablation of laser beam, and is used for supporting and fixing the workpiece (small pieces of element) in dicing and subsequent respective processes.

The inventor has estimated the cause of failure of dicing the workpiece into individual chips to be present in the adhesive sheet used for supporting and fixing the workpiece. As discovered by the inventor, if the base material surface of the adhesive sheet has convex parts of width (W) of 20 mm or less and height (h) of 1 µm or more, or concave parts of width (W) of 20 mm or less and depth (d) of 1 µm or more, when the adhesive sheet is glued to the workpiece, the flatness of the workpiece may be disturbed by the effects of undulations, and the focusing region of laser beam may be deviated, and the height of the reformed region formed inside the workpiece is uneven, and thereby the workpiece cannot be diced neatly into individual chips.

Such undulations are considered to be formed in the manufacturing process of adhesive sheet. For example, in heat treatment process for stabilizing the characteristics of the adhesive, the base material partly shrinks to form undulations. Or in the process of heating of rolled laminated sheet (adhesive sheet) or storing the adhesive sheet in rolled state, the base material surface not contacting with the adhesive layer adheres to the smooth separator for protecting the surface of adhesive layer, and as pressure is applied to the separator, the base material is deformed to form undulations.

Figure 1:
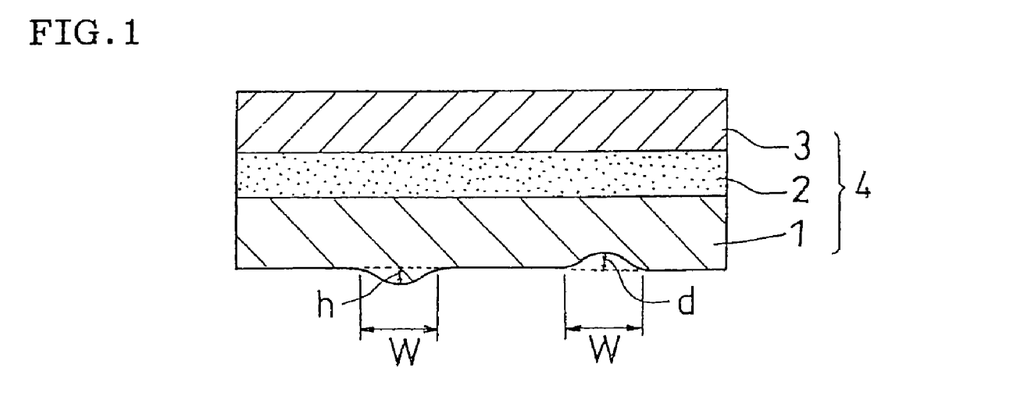
FIG. 1 is a schematic diagram showing a section of adhesive sheet for laser dicing of the invention.

FIG. 1 is a schematic diagram showing a section of adhesive sheet of the invention. As shown in FIG. 1, the width (W) of convex part is the maximum interval (mm) from the start point to end point of convex part, and the width (W) of concave part is the maximum interval (mm) from the start point to end point of concave part. The height (h) of convex part is the maximum height (μm) of convex part from the base material surface, and the depth (d) of concave part is the maximum depth (μm) of concave part from the base material surface.

The adhesive sheet of the invention is required to be free from such convex parts and concave parts of width (W) of 20 mm or less on the base material surface. If convex parts or concave parts exceeding the width (W) of 20 mm are present on the base material surface, by using the laser dicing apparatus with height adjusting mechanism, the apparatus can sufficiently correspond to height changes of the workpiece flexible, and there is no problem.

In the adhesive sheet of the invention, the adhesive agent for forming the adhesive layer is preferred to be a radiation curing type adhesive. When using a radiation curing type adhesive, the adhesiveness of the adhesive layer is lowered by irradiation with radiation (for example, ultraviolet ray), and therefore after emitting radiation to the adhesive layer after forming a reformed region, the adhesive sheet can be peeled off easily.

Also in the adhesive sheet of the invention, the base material is preferred to be free from necking property. The necking property is a nature of elongating depending on the stress until rupture in tensile strength test. When dicing into individual chips by expanding, in the case of a base material having necking property, only the stressed portion is expanded, and the stress is not applied uniformly to the entire base material, and the central area is not diced into individual chips. As a material free from necking properly, in particular, it is preferred to use polyvinyl chloride.

In the adhesive sheet of the invention, preferably, a separator is disposed on the adhesive layer. By using the separator, the laminated sheet (adhesive sheet) can be heated or stored in roll. Or, before use of adhesive sheet, the surface of the adhesive layer can be protected from dust and foreign matter.

The invention relates to a manufacturing method of adhesive sheet for laser dicing characterized by not heating a laminated sheet having at least an adhesive layer on one side of a base material. Without heat treatment of laminated sheet, partial deformation of base material by heat can be prevented, and hence formation of undulations on the base material surface can be suppressed.

The invention relates also to a manufacturing method of adhesive sheet for laser dicing comprising a step of disposing an adhesive layer on one side of a base material, a step of fabricating a laminated sheet by stacking a separator on the adhesive layer, a step of fabricating a rolled laminated sheet by taking up the laminated sheet in roll, and a step of heating the rolled laminated sheet.

The arithmetic average height Ra of the surface of the base material not contacting with the adhesive layer is preferred to be 0.4 μm or more. When the laminated sheet is taken up in roll, the surface of the base material and the surface of the separator contact with each other, but if the surface of the base material is too smooth (Ra is less than 0.4 μm), the base material tightly contacts with the separator surface and does not slide smoothly. When the rolled laminated sheet is heated in such state, not only the base material shrinks, but also a pressure is applied to the separator, and lots of local undulations tend to be formed on the base material surface. Besides, if the surface of the base material is too smooth, the frictional force of base material and attraction stage increases, and expanding is not uniform, and hence the workpiece cannot be easily diced into individual chips.

The surface of the separator not contacting with the adhesive layer is preferred to be in sprinkled or rough structure. When taking up the laminated sheet in roll, when the surface of the separator contacting with the base material is in sprinkled or rough structure, the contact tightness with the base material surface is lessened, the sliding performance of the base material may be enhanced. As a result, if the base material shrinks by heat treatment, since the sliding performance of the base material and separator is excellent, local deformation is suppressed, and local formation of undulations on the base material surface can be prevented.

The invention further relates to a manufacturing method of small pieces of element comprising a step of adhering an adhesive layer of adhesive sheet for laser dicing to one side of a workpiece, a step of forming a reformed region in the workpiece by emitting laser beam, a step of dicing the workpiece into individual chips by expanding the adhesive sheet for laser dicing, and a step of peeling off the adhesive sheet for laser dicing from the separated workpiece.

DESCRIPTION OF THE PREFERRED EMBODIMENTS

Laser used in the invention is not particularly specified as far as a reformed region can be formed in the workpiece by multiple photon absorption, and usable examples include YAG laser of transmission wavelength of 1064 nm, $YVO_4$ laser, YLF laser, and titanium sapphire laser. A proper type of laser can be selected depending on the material of the workpiece. For example, for silicon wafer, it is preferred to use YAG laser.

The workpiece is not particularly limited as far as a reformed region can be formed in the workpiece by light absorption ablation of laser beam emitted from the laser, and examples include sheet material, circuit board, semiconductor wafer, glass substrate, ceramic substrate, metal substrate, light emitting or detecting element board of semiconductor laser, MEMS (micro-electromechanical system) board, and semiconductor package.

The adhesive sheet for laser dicing of the invention can be preferably used in laser dicing of semiconductor wafer, in particular.

The sheet material includes, for example, high polymer films and nonwoven cloths made of polyimide resin, polyester resin, epoxy resin, urethane resin, polystyrene resin, polyethylene resin, polyamide resin, polycarbonate resin, silicone resin, fluorine resin, and others, sheets having physical or optical function by drawing process or impregnating process of these resins, metal sheets of copper, aluminum, stainless steel or the like, or the high polymer films and/or metal sheets laminated directly or by way of adhesive or the like.

The circuit board includes one-side or both-side multilayer flexible printed board, rigid board of glass epoxy, ceramic, or metal core board, optical circuit formed on glass or polymer, and photo-electric mixed circuit board.

An adhesive sheet 4 of the invention has at least an adhesive layer 2 on one side of a base material 1 as shown in FIG. 1. To take up the laminated sheet in roll, a separator 3 may be disposed on the adhesive layer 2.

The forming material of a base material includes, for example, polyethylene terephthalate, polyethylene naphthalate, polystyrene, polycarbonate, polyimide, (meth)acrylic polymer, polyurethane resin, polynorbornene resin, polyethylene glycol, polytramethylene glycol, other polyalkylene glycol resin, silicone rubber, polyethylene, polypropylene, polybutadiene, polyvinyl alcohol, ethylene-vinyl acetate copolymer (EVA), polymethyl pentene, polyvinyl chloride, and other polyolefin resins, but is not limited to these examples alone.

Above all, it is preferred to use a polymer free from necking property, and examples of such polymer include, among others, polybutadiene, EVA, polyvinyl chloride, other polymers having rubber elasticity, alpha-olefin polymer, and others. In particular, the base material is preferred to be formed of soft vinyl chloride.

The base material may be either single layer or plural layers.

The thickness of the base material may be properly adjusted within a range not sacrificing the handling property or working efficiency in each process, such as gluing to the workpiece, laser dicing of workpiece, and peeling and collection of small pieces of element, and usually it is about 50 to 300 μm, or preferably 50 to 150 μm. One side of the base material may be treated, for example, by common surface treatment for enhancing the adhesion or holding property to the adhesive layer, such as chromate treatment, ozone exposure, flame exposure, high voltage electric shock exposure, ionization radiation treatment, other chemical or physical treatment, or coating treatment by undercoat paint (for example, by adhesive substance mentioned below). The arithmetic average height Ra of the surface of other side of the base material is preferred to be 0.4 μm or more, and more preferably 0.5 μm or more. However, to prevent formation of undulations, the arithmetic average height Ra is preferred to be 1 μm or less, and more preferably 0.9 μm or less.

Forming materials of adhesive layer include known adhesive materials including (meth)acrylic polymer and rubber polymer.

Monomer components for forming (meth)acrylic polymer are alkyl (meth)acrylates having alkyl radical of straight chain or branch chain with 30 carbon atoms or less, or preferably 4 to 18 carbon atoms, including, for example, methyl radical, ethyl radical, n-propyl radical, isopropyl radical, n-butyl radical, t-butyl radical, isobutyl radical, amyl radical, isoamyl radical, hexyl radical, heptyl radical, cyclohexyl radical, 2-ethyl hexyl radical, octyl radical, iso-octyl radical, nonyl radical, isononyl radical, decynol radical, isodecyl radical, undecyl radical, lauryl radical, tridecyl radical, tetradecyl radical, stearyl radical, octadecyl radical, and dodecyl radical. These alkyl (meth)acrylates may be used either alone or in combination of two or more types.

In order to modify the adhesiveness, coagulation or heat resistance of (meth)acrylic polymer, other monomer components than mentioned above may be copolymerized as required. Other monomers capable of forming such polymers include, for example, acrylic acid and methacrylic acid, carboxyethylacrylate and carboxypentylacrylate, itaconic acid and maleic acid, fumaric acid and crotonic acid or other monomer containing carboxyl radical, maleic anhydride and itaconic anhydride or other monomer of acid anhydride, (meth)acrylic acid 2-hydroxyl ethyl and (meth)acrylic acid 2-hydroxyl propyl, (meth)acrylic acid 4-hydroxyl butyl and (meth)acrylic acid 6-hydroxylhexyl, (meth)acrylic acid 8-hydroxyoctyl and (meth)acrylic acid 10-hydroxyl decyl, (meth)acrylic acid 12-hydroxylauryl and (4-hydroxymethyl cyclohexyl)-methylacrylate or other monomer containing hydroxyl radical, styrene sulfonic acid and acrylic sulfonic acid, 2-(meth)acrylic amide-2-methyl propane sulfonic acid and (meth)acrylic amide propane sulfonic acid, sulfopropyl (meth)acrylate and (meth)acryloyl oxynaphthalene sulfonic acid or other monomer containing sulfonic acid radical, 2-hydroxy ethyl acryloyl phosphate or other monomer containing phosphoric acid radical, (meth)acrylic amide, (meth)acrylic acid N-hydroxymethyl amide, (meth)acrylic acid alkyl aminoalkyl ester (for example, dimethyl aminoethyl methacrylate), t-butyl aminoethyl methacrylate, etc.), N-vinyl pyrrolidone, acryloyl morphorine, vinyl acetate, styrene, acrylonitrile, etc. These monomer components may be used either alone or in combination of two or more types.

In addition, for the purpose of crosslinking of (meth)acrylic polymer or the like, multifunctional monomers and the like may be added as required as monomer component for copolymerization.

Examples of such monomer include hexanediol di(meth)acrylate, (poly)ethyleneglycol di(meth)acrylate, (poly)propyleneglycol di(meth)acrylate, neopentylglycol di(meth)acrylate, pentaerythritol di(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, epoxy (meth)acrylate, polyester (meth)acrylate, urethane (meth)acrylate, and others. One type or two or more types of multifunctional monomer may be used.

The content of multifunctional monomer is preferred to be 30 wt % or less of the total monomer content from the viewpoint of adhesiveness and others, and more preferably 15 wt % or less.

To prepare (meth)acrylic polymer, various methods may be applied, for example, solution polymerization method of mixture containing one, two or more types of monomer components, emulsification polymerization method, block polymerization, and suspension polymerization method.

Polymerization initiator includes peroxides such as hydrogen peroxide, benzoyl peroxide, and t-butyl peroxide. It is preferred to use alone, but it may be combined with reducer to be used as redox polymerization initiator. The reducer includes sulfite, hydrogen sulfite, iron, copper, cobalt salt, or other ionized salt, triethanolamine and other amines, aldose, ketose, and other reducing sugar. An azo compound is also a preferred polymerization initiator, and its example includes 2,2'-azobis-2-methylpropio amidinate, 2,2'-azobis-2,4-dimethyl valeronitrile, 2,2'-azobis-N,N'-dimethylene isobutyl amidinate, 2,2'-azobis isobutyronitrile, and 2,2'-azobis-2-methyl-N-(2-hydroxy ethyl) propione amide. Two or more types of these polymerization initiators may be used in combination.

Reaction temperature is usually about 50 to 85° C., and the reaction time is about 1 to 8 hours. Among the manufacturing method, solution polymerization is preferred, and as solvent of (meth)acrylic polymer, generally, ethyl acetate, toluene, and other polar solvents are used. The solution concentration is generally about 20 to 80 wt %.

The adhesive agent may be properly combined with a crosslinking agent for raising the number-average molecular weight of (meth)acrylic polymer used as base polymer. Examples of crosslinking agent include polyisocyanate compound, epoxy compound, aziridine compound, melamione resin, urea resin, anhydrous compound, polyamine, and polymer containing carboxyl radical. When the crosslinking agent is used, its content must be determined so that the peel adhesive strength may not be lowered too much, and generally it is preferred to add by about 0.01 to 5 parts by weight in 100 parts by weight of base polymer. The adhesive agent for forming the adhesive layer may be also combined with other known additives as required, in addition to the specified components, such as adhesion improver, aging retardant, filler, coloring matter, and others.

To improve peeling from workpiece, the adhesive agent is preferred to be radiation curing type adhesive which is cured by radiation such as ultraviolet ray or electron ray. When a radiation curing type adhesive is used as the adhesive agent, since the adhesive layer is irradiated with radiation after laser processing, the base material is preferred to have a sufficient radiation transmissivity.

The radiation curing type adhesive is not particularly limited as far as it is adhesive and has a radiation curing functional group such as carbon-carbon double bond. As the radiation curing type adhesive, for example, a radiation curing type adhesive blending radiation curing monomer component or oligomer component to the above (meth)acrylic polymer may be used.

Examples of monomer component or oligomer component of radiation curing type to be blended include urethane; (meth)acrylate oligomer, trimethylol propane tri(meth)acrylate, tetramethylol methane tetra(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butylene glycol di(meth)acrylate, and others. One type or two or more types of monomer component or oligomer component may be used.

The blending amount of radiation curing monomer component or oligomer component is not particularly specified, but considering the adhesiveness, it is preferred to add by about 5 to 500 parts by weight in 100 parts by weight of base polymer such as (meth)acrylic polymer for composing the adhesive agent, and more preferably by about 60 to 150 parts by weight.

As the radiation curing type adhesive, further, a base polymer having carbon-carbon double bond in the polymer side chain, main chain or main chain end may be used. Such base polymer is preferred to have (meth)acrylic polymer as basic skeleton. In this case, radiation curing type monomer component or oligomer component may not be added, and its use is free.

The radiation curing type adhesive should contain a photopolymerization initiator when curing by ultraviolet ray or the like. Examples of photopolymerization initiator include 4-(2-hydroxyethoxy)phenyl(2-hydroxy-2-propyl)ketone, α-hydroxy-α, α-methyl acetophenone, methoxy acetophenone, 2,2-dimethoxy-2-phenyl acetophenone, 2,2-diethoxy acetophenone, 1-hydroxy cyclohexyl phenyl ketone, 2-methyl-1-[4-(methylthio)-phenyl]-2-morpholinopropane-1, other acetophenone compounds, benzoin ethyl ether, benzoin isopropylether, anizoin methyl ether, other benzoin ether compounds, 2-methyl-2-hydroxypropylphenone, other α-ketol compounds, benzyl dimethyl ketal, other ketal compounds, 2-naphthalene sulfonyl chloride, other aromatic sulfonyl chloride compounds, 1-phenone-1,1-propanedione-2-(o-ethoxy carbonyl) oxime, other photoactive oxime compounds, benzophenone and benzoyl benzoic acid, 3,3'-dimethyl-4-methoxybenzophenone, other benzophenone compounds, thioxanthone, 2-chlorothioxanthone, 2-methyl thioxanthone, 2,4-dimethyl thioxanthone, isopropyl thioxanthone, 2,4-dichlorothioxanthone, 2,4-diethyl thioxanthone, 2,4-diisopropyl thioxanthone, other thioxanthone compounds, and also campher quinone, ketone halide, acyl phosphino oxide, acyl phosphoanate, etc.

The content of photopolymerization initiator is preferred to be about 0.1 to 10 parts by weight in 100 parts by weight of base polymer such as (meth)acrylic polymer for composing the adhesive agent, or more preferably about 0.5 to 10 parts by weight.

The adhesive sheet for laser dicing of the invention may be manufactured by applying an adhesive solution to the surface of the base material, drying (heating and crosslinking as required), and forming an adhesive layer. In other method, an adhesive layer is formed on a peeling liner, and it is glued to a base material.

The adhesive layer is preferred to be low in content of low molecular substance from the viewpoint of prevention of contamination on workpiece. From such point of view, the number-average molecular weight of (meth)acrylic polymer is preferred to be 300,000 or more, more preferably 400,000 to 3,000,000.

The thickness of adhesive layer may be properly selected within a range not peeling from the workpiece, and is preferred to be about 4 to 50 μm, more preferably about 5 to 20 μm.

The adhesive strength of adhesive layer is preferred to be 20 N/20 mm or less on the basis of adhesive strength (90-degree peel value, peeling speed 300 mm/min) at ordinary temperature (before laser emission) on SUS304, and more preferably 0.001 to 10 N/20 mm, or further preferably 0.01 to 8 N/20 mm.

On the surface of adhesive layer of adhesive sheet for laser dicing of the invention, it is preferred to dispose a separator for protecting the adhesive layer for labeling, or for the ease of heat treatment or storage by taking up the laminated sheet in roll.

The separator forming material includes polyether ether ketone, polyether imide, polyallylate, polyethylene naphthalate, polyethylene film, polypropylene film, polybutene film, polybutadiene film, polymethyl pentene film, polyvinyl chloride film, vinyl chloride copolymer film, polyethylene terephthalate film, polybutylene terephthalate film, polyurethane film, ethylene-vinyl acetate copolymer film, ionomer resin film, ethylene-(meth)acrylic acid copolymer film, ethylene-(meth)acrylate ester copolymer film, polystyrene film, polycarbonate film, and other plastic films.

One side of the separator may be treated for enhancing the peeling property from the adhesive layer, as required, by silicone process, long-chain alkyl process, fluorine process, or other peeling process. Further, as required, ultraviolet transmission preventive treatment may be applied to prevent reaction of adhesive sheet for laser dicing by environmental ultraviolet ray. The thickness of the separator is usually about 5 to 200 μm, preferably 25 to 100 μm, and more preferably 38 to 60 μm.

The surface of the separator not contacting with the adhesive layer is preferred to be in sprinkled or rough structure. These shapes can be formed by sand blasting or chemical etching. The separator can be also formed by using metal roll or rubber roll. The arithmetic average height Ra of the surface of the separator not contacting with the adhesive layer is preferred to be 0.2 to 2 μm, and more preferably 0.3 to 1.5 μm. If the arithmetic average height Ra is less than 0.2 μm, when the laminated sheet (adhesive sheet) is taken up in roll, the adhesion with the surface of base material increases, and the base material is likely to be integrated with the separator. When the rolled laminated sheet is heated in such state, not only the base material shrinks, but also a pressure is applied to the separator, and lots of local undulations tend to be formed on the base material surface. On the other hand, when the arithmetic average height Ra is more than 2 μm, convex part and concave part shapes of the separator are transferred on the base material surface, and convex parts of more than 1 μm in height (h) or concave parts of more than 1 μm in depth (d) may be formed on the base material surface.

The laminated sheet having a separator on the adhesive layer is preferred to be heated in rolled state. By heating the laminated sheet, the characteristics of the adhesive can be stabilized. In heat treatment, the temperature is in a range of 30 to 60° C., and the treatment time is about 12 to 100 hours. The adhesive sheet thus manufactured is free from convex parts of width (W) of 20 mm or less and height (h) of 1 μm or more, and concave parts of width (W) of 20 mm or less and depth (d) of 1 μm or more, at least on the base material surface not contacting with the adhesive layer.

A manufacturing method of small pieces of element by light absorption ablation of laser beam by using the adhesive sheet is explained below.

Figure 2:
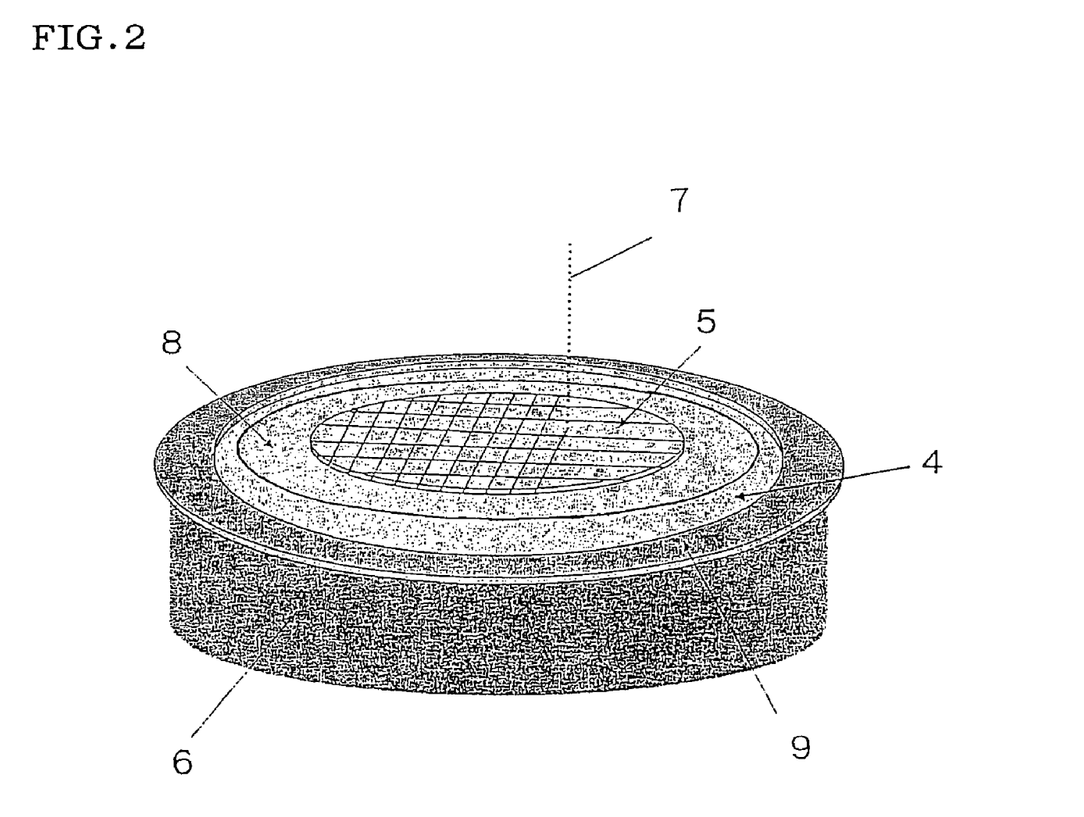
FIG. 2 is a schematic diagram showing an example of dicing method of semiconductor wafer.

In the case of laser dicing process of semiconductor wafer, as shown in FIG. 2, one side of semiconductor wafer 5 is glued to the adhesive sheet 4 disposed on the attraction stage 6, and the laser beam 7 emitted from a specified laser oscillator is focused to illuminate the inside of the semiconductor wafer 5 by a lens, and the laser illuminated position is moved along the specified processing line, so that a reformed region is formed inside the semiconductor wafer 5. The laser beam moving means is realized by any known laser processing method, such as galvano scan, X-Y stage scan, mask, or imaging process. A protective sheet 8 may be provided at the laser beam incident side of the semiconductor wafer 5.

After forming a reformed region in the semiconductor wafer, by expanding the adhesive sheet, the semiconductor wafer is cut from the reformed region, and adjacent small pieces of element (semiconductor chips) are broken apart. Then, by the known die bonder or similar device, the small pieces of element are picked up by using a poking pin known as needle, or the small pieces of element are picked up and collected by known method such as the method disclosed in Japanese patent publication No. 2001-118862.

In the manufacturing method of small pieces of element of the invention, after dicing into small pieces of element by expanding, the adhesive sheet 4 is peeled off, and the small pieces of element are collected. The peeling method is not particularly specified, but it is important not to apply stress to cause permanent deformation of small pieces of element at the time of peeling. For example, when a radiation curing type adhesive is used for the adhesive layer 2 of the adhesive sheet 4, radiation is applied depending on the material of the adhesive agent, and the adhesive layer is cured and the adhesiveness is lowered. By application of radiation, the adhesiveness of the adhesive layer is lowered by curing, and it is peeled easily. Application means of radiation is not specified, and, for example, ultraviolet ray may be applied.

EXAMPLES

The invention is described below by referring to preferred examples, but the invention is not limited to these examples alone.

[Measurement of Number-average Molecular Weight]

Number-average molecular weight of synthesized (meth) acrylic polymer was measured in the following method. The synthesized (meth)acrylic polymer was dissolved in THF at 0.1 wt. %, and the number-average molecular weight was measured by converting into polystyrene by using GPC (gel permeation chromatography). The measuring conditions are as follows.

GPC apparatus: HLC-8120GPC of TOSOH CORPORATION
Column: $(GMH_{HR}\text{-}H)+(GMH_{HR}\text{-}H)+(G2000H_{HR})$, of TOSOH CORPORATION
Flow rate: 0.8 mL/min
Concentration: 0.1 wt. %
Injection volume: 100 μL
Column temperature: 40° C.
Eluate: THF

[Measurement of Arithmetic Average Height (Ra)]

Measured according to JIS B 0601-2001. The measuring apparatus was P-11 (contact type) of Tencor Corporation.

Example 1

In ethyl acetate, 70 parts by weight of methyl acrylate, 30 parts by weight of butyl acrylate, and 5 parts by weight of acrylic acid were copolymerized, and a solution containing acrylic polymer of number-average molecular weight of 800,000 was obtained. In this solution, 60 parts by weight of dipentaerythritol hexacrylate (KAYARAD DPHA of NIPPON KAYAKU Co., Ltd.), 5 parts by weight of radical polymerization initiator (IRGACURE 651 of Ciba Specialty Chemicals Co., Ltd.), and 3 parts by weight of polyisocyanate compound (Coronate L of NIPPON POLYURETHANE INDUSTRY CO., LTD) were added, and an ultraviolet curing type acrylic adhesive agent was prepared.

The adhesive agent was applied on one side of a soft vinyl chloride film (thickness 80 μm), and heated and dried, and an ultraviolet curing type adhesive layer (thickness 5 μm) was formed. A separator (Lumirror S-10 of Toray Industries CO., LTD, polyester film of 38 μm in thickness with peeling treatment applied on the adhesive layer gluing side) was glued to the adhesive layer, and a laminated sheet was manufactured. The arithmetic average height (Ra) of the surface of the soft vinyl chloride film not contacting with the adhesive layer was 0.72 μm. The arithmetic average height (Ra) of the surface of the separator not contacting with the adhesive layer was 0.03 μm.

The fabricated laminated sheet was taken up in roll, and a laminated sheet roll was formed, and it was heated for 24 hours at 50° C. After heat treatment, the adhesive sheet for laser dicing (100 mm×100 mm) was cut out from the laminated sheet roll, and the arithmetic average height (Ra) of the surface of the soft vinyl chloride film not contacting with the adhesive layer was measured, and the minimum value was 0.48 μm.

The adhesive sheet was glued to the polished side (reverse side) of the silicon wafer, the base material surface of the adhesive sheet glued to the silicon wafer was observed by laser microscope, and the surface was free from convex parts of width (W) of 20 mm or less and height (h) of 1 μm or more, and concave parts of width (W) of 20 mm or less and depth (d) of 1 μm or more.

Example 2

In toluene, 70 parts by weight of butyl acrylate, 30 parts by weight of 2-ethyl hexyl acrylate, and 5 parts by weight of acrylic acid were copolymerized, and a solution containing acrylic polymer of number-average molecular weight of 700,000 was obtained. In this solution, 30 parts by weight of dioctyl phthalate, and 5 parts by weight of polyisocyanate compound (Coronate L of NIPPON POLYURETHANE INDUSTRY CO., LTD) were added, and an ultraviolet curing type acrylic adhesive agent was prepared.

The adhesive agent was applied on one side of a soft vinyl chloride film (thickness 70 μm), and heated and dried, and an ultraviolet curing type adhesive layer (thickness 10 μm) was formed. A separator (Lumirror S-10 of Toray Industries CO., LTD, polyester film of 38 μm in thickness with peeling treatment applied on the adhesive layer gluing side) was glued to the adhesive layer, and a laminated sheet was manufactured. The arithmetic average height (Ra) of the surface of the soft vinyl chloride film not contacting with the adhesive layer was 0.58 μm. The surface of the separator not contacting with the adhesive layer was roughened by sand blasting before gluing. The arithmetic average height (Ra) of the surface was 0.33 μm.

The fabricated laminated sheet was taken up in roll, and a laminated sheet roll was formed, and it was heated for 24 hours at 50° C. After heat treatment, the adhesive sheet for laser dicing (100 mm×100 mm) was cut out from the laminated sheet roll, and the arithmetic average height (Ra) of the surface of the soft vinyl chloride film not contacting with the adhesive layer was measured, and the minimum value was 0.44 μm.

The adhesive sheet was glued to the polished side (reverse side) of the silicon wafer, the base material surface of the adhesive sheet glued to the silicon wafer was observed by laser microscope, and the surface was free from convex parts of width (W) or 20 mm or less and height (h) of 1 μm or more, and concave parts of width (W) of 20 mm or less and depth (d) of 1 μm or more.

Example 3

An ultraviolet curing type acrylic adhesive agent was prepared in the same manner as in example 1. The adhesive agent was applied on the surface of poly-α-olefin film (thickness 80 μm) having corona treatment applied on one side, and heated and dried, and an ultraviolet curing type adhesive layer (thickness 5 μm) was formed. A separator (Lumirror S-10 of Toray Industries CO., LTD, polyester film of 38 μm in thickness with peeling treatment applied on the adhesive layer gluing side) was glued to the adhesive layer, and an adhesive sheet for laser dicing was manufactured. The arithmetic average height (Ra) of the surface of the poly-α-olefin film not contacting with the adhesive layer was 0.55 μm. The arithmetic average height (Ra) of the surface of the separator not contacting with the adhesive layer was 0.03 μm.

The adhesive sheet (100 mm×100 mm) was glued to the polished side (reverse side) of the silicon wafer, the base material surface of the adhesive sheet glued to the silicon wafer was observed by laser microscope, and the surface was free from convex parts of width (W) of 20 mm or less and height (h) of 1 μm or more, and concave parts of width (W) of 20 mm or less and depth (d) of 1 μm or more.

Example 4

An ultraviolet curing type acrylic adhesive agent was prepared in the same manner as in example 2. The adhesive agent was applied on the surface of EVA film (thickness 115 μm) having corona treatment applied on one side, and heated and dried, and an ultraviolet curing type adhesive layer (thickness 10 μm) was formed. A separator (Lumirror S-10 of Toray Industries CO., LTD, polyester film of 38 μm in thickness with peeling treatment applied on the adhesive layer gluing side) was glued to the adhesive layer, and an adhesive sheet for laser dicing was manufactured. The arithmetic average height (Ra) of the surface of the EVA film not contacting with the adhesive layer was 0.53 μm. The arithmetic average height (Ra) of the surface of the separator not contacting with the adhesive layer was 0.03 μm.

The adhesive sheet (100 mm×100 mm) was glued to the polished side (reverse side) of the silicon wafer, the base material surface of the adhesive sheet glued to the silicon wafer was observed by laser microscope, and the surface was free from convex parts of width (W) of 20 mm or less and height (h) of 1 μm or more, and concave parts of width (W) of 20 mm or less and depth (d) of 1 μm or more.

Comparative Example 1

An ultraviolet curing type acrylic adhesive agent was prepared in the same manner as in example 1. The adhesive agent was applied on one side of soft vinyl chloride film (thickness 80 μm), and heated and dried, and an ultraviolet curing type adhesive layer (thickness 5 μm) was formed. A separator (Lumirror S-10 of Toray Industries CO., LTD, polyester film of 38 μm in thickness with peeling treatment applied on the adhesive layer gluing side) was glued to the adhesive layer, and a laminated sheet was manufactured. The arithmetic average height (Ra) of the surface of the soft vinyl chloride film not contacting with the adhesive layer was 0.32 μm. The arithmetic average height (Ra) of the surface of the separator not contacting with the adhesive layer was 0.03 μm.

The fabricated laminated sheet was taken up in roll, and a laminated sheet roll was formed, and it was heated for 24 hours at 50° C. After heat treatment, the adhesive sheet for laser dicing (100 mm×100 mm) was cut out from the laminated sheet roll, and the arithmetic average height (Ra) of the surface of the soft vinyl chloride film not contacting with the adhesive layer was measured, and the minimum value was 0.20 μm.

The adhesive sheet was glued to the polished side (reverse side) of the silicon wafer, the base material surface of the adhesive sheet glued to the silicon wafer was observed by laser microscope, and the surface contained one convex part of width (W) of 20 mm or less and height (h) of 1 μm or more, and one concave part of width (W) of 20 mm or less and depth (d) of 1 μm or more.

Comparative Example 2

An ultraviolet curing type acrylic adhesive agent was prepared in the same manner as in example 2. The adhesive agent was applied on the surface of EVA film (thickness 115 μm) having corona treatment applied on one side, and heated and dried, and an ultraviolet curing type adhesive layer (thickness 10 μm) was formed. A separator (Lumirror S-10 of Toray Industries CO., LTD, polyester film of 38 μm in thickness with peeling treatment applied on the adhesive layer gluing side) was glued to the adhesive layer, and a laminated sheet was manufactured. The arithmetic average height (Ra) of the surface of the EVA film not contacting with the adhesive layer was 0.34 μm. The arithmetic average height (Ra) of the surface of the separator not contacting with the adhesive layer was 0.03 μm.

The fabricated laminated sheet was taken up in roll, and a laminated sheet roll was formed, and it was heated for 24 hours at 50° C. After heat treatment, the adhesive sheet for laser dicing (100 mm×100 mm) was cut out from the laminated sheet roll, and the arithmetic average height (Ra) of the surface of the EVA film not contacting with the adhesive layer was measured, and the minimum value was 0.18 μm.

The adhesive sheet was glued to the polished side (reverse side) of the silicon wafer, the base material surface of the adhesive sheet glued to the silicon wafer was observed by laser microscope, and the surface contained one convex part of width (W) of 20 mm or less and height (h) of 1 μm or more, and one concave part of width (W) of 20 mm or less and depth (d) of 1 μm or more.

Reference Example 1

An ultraviolet curing type acrylic adhesive agent was prepared in the same manner as in example 1. The adhesive agent was applied on the surface of polyethylene film (thickness 80 μm) having corona treatment applied on one side, and heated and dried, and an ultraviolet curing type adhesive layer (thickness 5 μm) was formed.

A separator (Lumirror S-10 of Toray Industries CO., LTD, polyester film of 38 μm in thickness with peeling treatment applied on the adhesive layer gluing side) was glued to the adhesive layer, and an adhesive sheet for laser dicing was manufactured. The arithmetic average height (Ra) of the surface of the polyethylene film not contacting with the adhesive layer was 0.68 μm. The arithmetic average height (Ra) of the surface of the separator not contacting with the adhesive layer was 0.03 μm.

The adhesive sheet (100 mm×100 mm) was glued to the polished side (reverse side) of the silicon wafer, the base material surface of the adhesive sheet glued to the silicon wafer was observed by laser microscope, and the surface was free from convex parts of width (W) of 20 mm or less and height (h) of 1 μm or more, and concave parts of width (W) of 20 mm or less and depth (d) of 1 μm or more.

[Evaluation Tests]

The adhesive sheets manufactured in examples, comparative examples, and reference example were evaluated in the following tests.

(1) Tensile Test

A fabricated adhesive sheet was cut in a size of 10 mm in width and 100 mm in length, and the stress in tensile state was measured by using Tensilon. The pulling speed was 300 mm/min.

As a result, in the adhesive sheets of examples 1 to 4 and comparative examples 1 and 2, the stress increased depending on the tensile amount, and an S-S curve rising rightward was obtained. On the other hand, in the adhesive sheet of reference example 1, the stress dropped partially, and necking was observed.

(2) Expansion Test

A fabricated adhesive sheet was adhered to the polished side (reverse side) of the silicon wafer (thickness 50 μm), and the silicon wafer was diced by laser. As the laser, YAG laser with wavelength of 1064 mm was used. By using a focusing lens, the light was focused into a spot inside the silicon wafer. Then the silicon wafer was expanded by 20 mm by using an expander. As a result, in examples 1 to 4, the small pieces of element were neatly separated completely, but in comparative examples 1 and 2, small pieces of element were not separated partly. In reference example 1, the base material was torn apart, and small pieces of element could not be collected.

What is claimed is:

1. An adhesive sheet for laser dicing used for dicing a workpiece into individual chips by forming a reformed region inside the workpiece by light absorption ablation of laser beam, wherein the adhesive sheet has at least an adhesive layer on one side of a base material,
    wherein the base material has a surface having an arithmetic average height Ra of 0.4-0.9 μm,
    wherein said adhesive sheet is prepared by: disposing a separator on the adhesive layer to form a laminated sheet; taking up the laminated sheet in roll; heating the rolled laminated sheet at a temperature of 30 to 60° C. for 12 to 100 hours; and said adhesive sheet is cut from said rolled laminated sheet,
    wherein the surface of the base material that does not contact the adhesive layer is free from convex parts that have a height (h) of 1 μm or more over a width (W) of 20 mm or less, and concave parts that have a depth (d) of 1 μm or more over a width (W) of 20 mm or less,
    and wherein said separator comprises a surface not contacting with the adhesive layer that has an arithmetic average height Ra of 0.2 to 2 μm.

2. The adhesive sheet for laser dicing of claim 1, wherein the adhesive agent for forming the adhesive layer is a radiation curing type adhesive.

3. The adhesive sheet for laser dicing of claim 1, wherein the base material is free from necking property.

4. The adhesive sheet for laser dicing of claim 1, wherein the base material contains polyvinyl chloride as resin component.

5. An adhesive sheet for laser dicing of a workpiece in use, comprising a base material and an adhesive layer formed on one side of the base material, wherein the other side of the base material opposite to the adhesive layer has no convex parts that have a height (h) of 1 μm or more over a width (W) of 20 mm or less, or no concave parts that have a depth (d) of 1 μm or more over a width (W) of 20 mm or less, said adhesive layer being in contact with the workpiece, wherein the adhesive sheet is placed on a laser dicing stage with the other side facing down.

6. The adhesive sheet for laser dicing according to claim 5, wherein the base material has substantially no heat deformation.

7. The adhesive sheet according to claim 5, wherein the other side of the base material has an arithmetic average height (Ra) of 0.4 μm or higher.

8. The adhesive sheet according to claim 5, wherein the adhesive layer contains an adhesive agent which is a radiation curing type adhesive.

9. The adhesive sheet according to claim 5, wherein the base material contains polyvinyl chloride as a resin component.

10. The adhesive sheet for laser dicing of claim 1, wherein said base material comprises flexible vinyl chloride.

* * * * *

UNITED STATES PATENT AND TRADEMARK OFFICE
CERTIFICATE OF CORRECTION

PATENT NO.       : 7,564,119 B2
APPLICATION NO.  : 11/054795
DATED            : July 21, 2009
INVENTOR(S)      : Yuji Okawa It is certified that error appears in the above-identified patent and that said Letters Patent is hereby corrected as shown below:

At Column 5, Line 7, please delete "polytramethylene" and insert --polytertramethylene--, therefor.

At Column 5, Line 50, please delete "decynol" and insert --decanol--, therefor.

At Column 6, Line 13, please delete "morphorine," and insert --morpholine,--, therefor.

At Column 6, Line 64, please delete "melamione" and insert --melamine--, therefor.

At Column 7, Line 54, please delete "anizoin" and insert --benzoin--, therefor.

At Column 7, Line 66, please delete "campher quinine," and insert --camphorquinone,--, therefor.

At Column 10, Line 22, please delete "hexacrylate" and insert --hexaacrylate--, therefor.

At Column 13, Lines 14-22, please delete "A separator (Lumirror S-10 of Toray Industries CO., LTD, polyester film of 38 im in thickness with peeling treatment applied on the adhesive layer gluing side) was glued to the adhesive layer, and an adhesive sheet for laser dicing was manufactured. The arithmetic average height (Ra) of the surface of the polyethylene film not contacting with the adhesive layer was 0.68 im. The arithmetic average height (Ra) of the surface of the separator not contacting with the adhesive layer was 0.03 im." and after "formed." at Column 13, Line 13, please insert --A separator (Lumirror S-10 of Toray Industries CO., LTD, polyester film of 38 im in thickness with peeling treatment applied on the adhesive layer gluing side) was glued to the adhesive layer, and an adhesive sheet for laser dicing was manufactured. The arithmetic average height (Ra) of the surface of the polyethylene film not contacting with the adhesive layer was 0.68 im. The arithmetic average height (Ra) of the surface of the separator not contacting with the adhesive layer was 0.03 im.-- as a continuation of the same paragraph.

Signed and Sealed this

Fifteenth Day of June, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,564,119 B2 | |
| APPLICATION NO. | : 11/054795 | |
| DATED | : July 21, 2009 | |
| INVENTOR(S) | : Yuji Okawa | |

It is certified that error appears in the above-identified patent and that said Letters Patent is hereby corrected as shown below:

At Column 5, Line 7, please delete "polytramethylene" and insert --polytertramethylene--, therefor.

At Column 5, Line 50, please delete "decynol" and insert --decanol--, therefor.

At Column 6, Line 13, please delete "morphorine," and insert --morpholine,--, therefor.

At Column 6, Line 64, please delete "melamione" and insert --melamine--, therefor.

At Column 7, Line 54, please delete "anizoin" and insert --benzoin--, therefor.

At Column 7, Line 66, please delete "campher quinine," and insert --camphorquinone,--, therefor.

At Column 10, Line 22, please delete "hexacrylate" and insert --hexaacrylate--, therefor.

At Column 13, Lines 14-22, please delete "A separator (Lumirror S-10 of Toray Industries CO., LTD, polyester film of 38 μm in thickness with peeling treatment applied on the adhesive layer gluing side) was glued to the adhesive layer, and an adhesive sheet for laser dicing was manufactured. The arithmetic average height (Ra) of the surface of the polyethylene film not contacting with the adhesive layer was 0.68 μm. The arithmetic average height (Ra) of the surface of the separator not contacting with the adhesive layer was 0.03 μm." and after "formed." at Column 13, Line 13, please insert --A separator (Lumirror S-10 of Toray Industries CO., LTD, polyester film of 38 μm in thickness with peeling treatment applied on the adhesive layer gluing side) was glued to the adhesive layer, and an adhesive sheet for laser dicing was manufactured. The arithmetic average height (Ra) of the surface of the polyethylene film not contacting with the adhesive layer was 0.68 μm. The arithmetic average height (Ra) of the surface of the separator not contacting with the adhesive layer was 0.03 μm.-- as a continuation of the same paragraph.

This certificate supersedes the Certificate of Correction issued June 15, 2010.

Signed and Sealed this
Twelfth Day of July, 2011

David J. Kappos
*Director of the United States Patent and Trademark Office*